US005542113A

United States Patent [19]
Fink et al.

[11] Patent Number: 5,542,113
[45] Date of Patent: Jul. 30, 1996

[54] CARRIER DERIVED FREQUENCY STABILIZER FOR A RADIO COMMUNICATION TRANSMITTER

[75] Inventors: Steven J. Fink, Hoffman Estates; Peter Nanni, Algonquin, both of Ill.

[73] Assignee: Motorola, Inc., Schaumburg, Ill.

[21] Appl. No.: 300,891

[22] Filed: Sep. 6, 1994

[51] Int. Cl.$^6$ .............................. H01Q 11/12; H03L 7/00
[52] U.S. Cl. .............................. 455/119; 455/75; 455/76; 455/113; 455/126; 331/25
[58] Field of Search .............................. 331/18, 25, 44; 455/119, 113, 75, 76, 115, 126, 260, 257, 192.1, 192.2, 196.1, 255, 256, 259, 264, 265

[56] References Cited

U.S. PATENT DOCUMENTS

| | | | |
|---|---|---|---|
| 4,703,520 | 10/1987 | Rozanski et al. | 455/75 |
| 4,980,653 | 12/1990 | Shepherd | 331/16 |
| 5,073,973 | 12/1991 | Ylivakeri | 455/76 |
| 5,121,417 | 6/1992 | Swierczek | 375/120 |
| 5,170,492 | 12/1992 | Moller et al. | 455/76 |
| 5,289,141 | 2/1994 | Nanni et al. | 332/101 |

*Primary Examiner*—Reinhard J. Eisenzopf
*Assistant Examiner*—Lee Nguyen
*Attorney, Agent, or Firm*—R. Louis Breeden

[57] ABSTRACT

A method and apparatus in a radio communication transmitter (600) stabilizes a carrier frequency locked to a reference oscillator (102). The reference oscillator (102) is controlled by a control signal and generates a first signal at a reference frequency. The first signal is coupled to a frequency multiplier (212) for multiplying the reference frequency by a predetermined factor to generate a second signal at the carrier frequency. Cycles of the carrier frequency are counted (508, 514) during a predetermined interval to determine (516, 518) a measured cycle count. The measured cycle count is compared (520) with an expected cycle count corresponding to a predetermined carrier frequency to determine a drift error. From the drift error a control signal adjustment required to correct the drift error is computed (522). The control signal of the reference oscillator (102) is adjusted (524) by the control signal adjustment to correct the drift error.

12 Claims, 4 Drawing Sheets

CARRIER DERIVED FREQUENCY STABILIZER FOR A RADIO COMMUNICATION TRANSMITTER

FIELD OF THE INVENTION

This invention relates in general to radio communication transmitters, and more specifically to a method and apparatus for stabilizing a carrier frequency generated in a radio communication transmitter.

BACKGROUND OF THE INVENTION

Conventional radio communication transmitters utilize high stability reference oscillators that require periodic adjustment to compensate for carrier drift. To meet the higher data rate constraints of future radio communication systems, e.g., future paging systems, precision automatic drift control systems will be required. Such systems will be required to constrain carrier drift with great precision. For example, some simulcast paging systems are expected to require drift control to less than 1 part per billion in the near future.

Conventional automatic drift control systems have utilized time-mark disciplined reference oscillators operating from a precision timing signal, such as a timing signal from a Global Positioning Satellite (GPS) receiver. The GPS receiver provides a 1 pulse-per-second (PPS) precision timing signal, which has been employed in conventional automatic drift control systems for measuring the frequency of the reference oscillator.

Unfortunately, the reference oscillator typically operates at a relatively low frequency, e.g., 6.25 kilohertz (KHz), compared to the carrier frequency, e.g., 900 megahertz (MHz), used for transmission by the radio communication transmitter. The relatively low frequency of the reference oscillator makes it difficult to accurately measure the frequency in a short time period, such as the 1 second period of the 1 PPS signal from the GPS receiver. This is so because there are a limited number of "events" (or cycles) that occur in 1 second of the low frequency reference signal. A 6.25 KHz signal, for example, can be measured only to an accuracy of 1 part in 6,250 without the addition of complex and expensive interpolation circuitry and/or multipliers for assessing a drift of less than 1 cycle during the measurement interval of 1 second.

Thus, what is needed is a reference oscillator automatic drift control system that can provide a much greater degree of precision over a given measurement interval than the conventional drift control system has been able to achieve. In addition, an economical automatic drift control system that provides the required precision without requiring additional interpolation circuitry and/or multipliers is needed.

SUMMARY OF THE INVENTION

One aspect of the present invention is a method in a radio communication transmitter for stabilizing a carrier frequency locked to a reference oscillator. The reference oscillator is controlled by a control signal and generates a first signal at a reference frequency. The first signal is coupled to a frequency multiplier for multiplying the reference frequency by a predetermined factor to generate a second signal at the carrier frequency. The frequency multiplier is coupled to a first counter for providing a first counter output. The method comprises the steps of counting cycles of the carrier frequency during a predetermined interval to determine a measured cycle count, and comparing the measured cycle count with an expected cycle count corresponding to a predetermined carrier frequency to determine a drift error. The method further comprises the steps of computing from the drift error a control signal adjustment required to correct the drift error, and adjusting the control signal of the reference oscillator by the control signal adjustment to correct the drift error.

Another aspect of the present invention is an apparatus in a radio communication transmitter for stabilizing a carrier frequency. The apparatus comprises a reference oscillator for generating a first signal at a reference frequency. The reference frequency is controlled by a control signal from a processor. The apparatus further comprises a frequency multiplier coupled to the reference oscillator for multiplying the reference frequency by a predetermined factor to generate a second signal at the carrier frequency. The apparatus also includes a first counter coupled to the frequency multiplier for counting cycles of the carrier frequency during a predetermined interval to determine a measured cycle count, the first counter having a first counter output port. In addition, the processor is coupled to the reference oscillator for controlling the same. The processor comprises a first comparator coupled to the first counter for comparing the measured cycle count with an expected cycle count corresponding to a predetermined carrier frequency to determine a drift error. The processor further comprises a computation element for computing from the drift error a control signal adjustment required to correct the drift error, and an adjustment element coupled to the computation element for adjusting the control signal for the reference oscillator by the control signal adjustment to correct the drift error.

Another aspect of the present invention is a radio communication transmitter, comprising an input interface for receiving from a central station information to be transmitted and commands for controlling the transmitter. The radio communication transmitter further comprises a modulator coupled to the input interface for modulating the transmitter in response to the information received, and a power supply circuit coupled to the input interface and to the modulator for providing power thereto. The radio communication transmitter also includes a power amplifier coupled to the power supply circuit for receiving power therefrom, and coupled to an apparatus for generating a stabilized carrier frequency, the apparatus also coupled to the power supply circuit for receiving power therefrom. The apparatus comprises a reference oscillator for generating a first signal at a reference frequency. The reference frequency is controlled by a control signal from a processor. The apparatus further comprises a frequency multiplier coupled to the reference oscillator for multiplying the reference frequency by a predetermined factor to generate a second signal at a carrier frequency. The frequency multiplier also is coupled to the modulator for modulating the carrier frequency in response to the modulator. The apparatus also includes a first counter coupled to the frequency multiplier for counting cycles of the carrier frequency during a predetermined interval to determine a measured cycle count, the first counter having a first counter output port, and the processor coupled to the reference oscillator for controlling the same. The processor comprises a first comparator coupled to the first counter for comparing the measured cycle count with an expected cycle count corresponding to a predetermined carrier frequency to determine a drift error. The processor further comprises a computation element for computing from the drift error a control signal adjustment required to correct the drift error, and an adjustment element coupled to the computation element for adjusting the control signal for the reference oscillator by the control signal adjustment to correct the drift error.

DESCRIPTION OF THE PREFERRED EMBODIMENT

Figure 1:
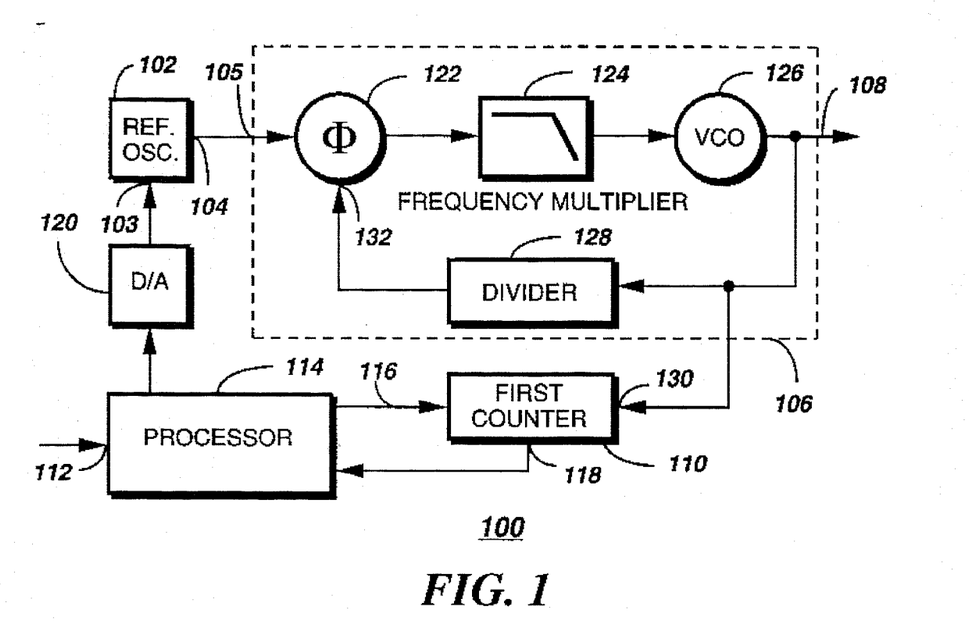
FIG. 1 is an electrical block diagram of a carrier derived frequency stabilizer in accordance with a first embodiment of the present invention.

Referring to FIG. 1, an electrical block diagram of a carrier derived frequency stabilizer 100 in accordance with a first embodiment of the present invention comprises a reference oscillator 102 having a high stability for generating a reference frequency signal at a reference frequency output 104. The frequency of the signal generated by the reference oscillator 102 is controlled by a control signal applied to a control input 103 through a digital to analog (D/A) converter 120 by a processor 114. The reference frequency signal is applied to the input 105 of a frequency multiplier 106, which multiplies the reference frequency by a predetermined factor to generate a carrier frequency signal at a carrier frequency output 108.

The carrier frequency signal at the carrier frequency output 108 is coupled to the input 130 of a first counter 110, which counts cycles of the carrier frequency during a predetermined interval to determine a measured cycle count. A latched count of the first counter 110 is read periodically by the processor 114 from a first counter output port 118. The first counter 110 is controlled by the processor 114 through a first counter control line 116 for temporarily latching the count at each boundary of the predetermined interval, so that the first counter 110 can continue to increment the count while the processor 114 reads the latched count. The predetermined interval is determined from a precision time signal applied to a time signal input 112 of the processor 114.

The processor 114 compares the latched count with an expected cycle count (CC) for the predetermined interval to determine the drift error. The drift error is computed as follows:

$$\text{Drift Error} = \frac{\text{Expected } CC - \text{Measured } CC}{\text{Expected } CC}.$$

Figure 4:
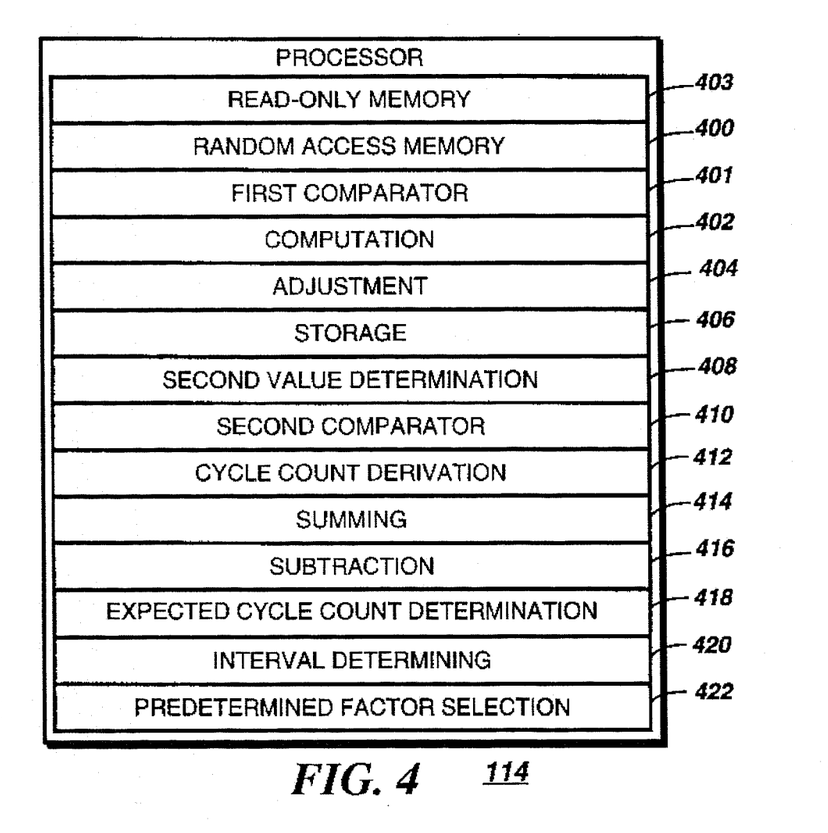
FIG. 4 is a functional block diagram of a processor utilized in the carrier derived frequency stabilizer and modulator in accordance with the preferred embodiment of the present invention.

The processor 114 then reads a Control Factor from the Read-Only Memory (ROM) 403 (FIG. 4) and computes a control signal adjustment needed for correcting the drift error, as follows:

Signal Adjustment=Drift Error×Control Factor.

The Control Factor comprises an empirically determined relationship between the Drift Error and the Signal Adjustment required to correct the Drift Error.

Next, the processor 114 reads the current control signal value from the random access memory (RAM) 400 (FIG. 4) and computes a new control signal (CS) value for the reference oscillator 102 as follows:

New CS=Current CS+Signal Adjustment.

The processor 114 then applies through the D/A converter 120 the new control signal value to the control input 103 of the reference oscillator 102 to correct the drift error. In addition, the processor replaces the current control signal value in the RAM 400 with the new control signal value.

The frequency multiplier 106 is preferably a digital phase locked loop comprising a phase comparator 122 having a first input coupled to the reference frequency signal at the input 105. The output of the phase comparator 122 is coupled to a low-pass filter 124 for generating an error signal for controlling a voltage controlled oscillator (VCO) 126, which generates the carrier frequency signal at the carrier frequency output 108. The carrier frequency signal is coupled to a divider 128 for dividing the carrier frequency by a division factor to produce a comparison signal at the reference frequency that is coupled to a second input 132 of the phase comparator 122 for comparison with the reference frequency signal.

Components used in constructing the carrier derived frequency stabilizer 100 are preferably as follows:

| | |
|---|---|
| the phase comparator 122 | part of MC145170; |
| the divider 128 | part of MC145170; |
| the VCO 126 | TTD1732A; |
| the reference oscillator 102 | KXN-1096A. |

The above components are available from Motorola, Inc., Schaumburg, Ill.

The low pass filter 124 is a discrete first order filter comprising a resistor coupled between the output of the phase comparator 122 and the input of the VCO 126, together with a capacitor coupled between the input of the VCO 126 and circuit ground. Other components and circuit architectures may be used as well in accordance with the present invention.

The processor 114 is preferably an MC68HC11-type microcontroller manufactured by Motorola, Inc. of Schaumburg, Ill. It will be appreciated that other functionally equivalent processors may be used as well. The first counter 110 is preferably similar to the MC10H131 counter manufactured by Motorola, Inc. of Schaumburg, Ill. Preferably, the maximum possible count of the first counter 110 is greater than the number of cycles of the carrier frequency to be counted during the predetermined measurement interval. The D/A converter 120 is a conventional logic circuit, readily available off-the-shelf. It will be appreciated that the D/A converter 120 alternatively can be fabricated as a contiguous element of the processor 114 as well.

Figure 2:
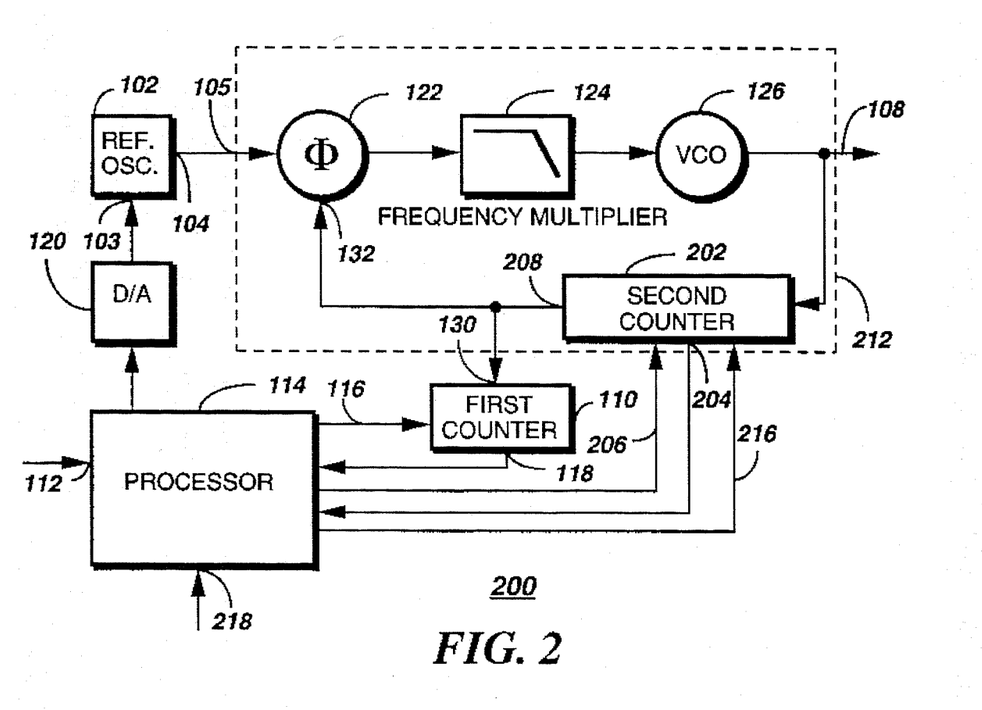
FIG. 2 is an electrical block diagram of a carrier derived frequency stabilizer in accordance with a second embodiment of the present invention.

Referring to FIG. 2, an electrical block diagram of a carrier derived frequency stabilizer 200 in accordance with a second embodiment of the present invention is similar to that of the carrier derived frequency stabilizer 100, the essential difference being that the divider 128 of the frequency multiplier 106 has been replaced with a second counter 202 having a second counter output port 204, which provides a latched count from the second counter 202. In addition, the input 130 of the first counter 110 is coupled to the output 208 of the second counter 202 instead of to the carrier frequency output 108. Like the divider 128, the second counter 202 also divides the carrier frequency by a division factor to produce a comparison signal at the reference frequency that is coupled to the second input 132 of the phase comparator 122.

The first and second counters 110, 202 preferably are similar to the MC10H131 counter manufactured by Motorola, Inc. of Schaumburg, Ill. Preferably, the maximum possible count of the first and second counters 110, 202 combined is greater than the number of cycles of the carrier frequency to be counted during the predetermined measurement interval. It will be appreciated that other similar counters can be substituted for the first and second counters 110, 202, and that the first and second counters 110, 202 can be fabricated as a single contiguous integrated circuit as well, with or without including other elements of the frequency multiplier 212.

The processor 114 preferably controls the latching of the count of the second counter 202 by a second counter control line 206. In addition, the processor 114 controls the predetermined factor by which the frequency multiplier 212 multiplies the reference frequency by controlling the division factor of the second counter 202 by a channel control line 216. The processor 114 controls the predetermined factor in response to channel selection information received from a base station controller 606 (FIG. 6) at a channel control input 218. Whenever the processor 114 changes the predetermined factor, the processor 114 also makes a corresponding change in an expected cycle count value, which is periodically compared with a measured cycle count from the first and second counters 110, 202, the cycle count being measured during the predetermined interval.

An advantage of replacing the divider 128 with the second counter 202 is circuit economy. This is so because much of the circuitry required to construct the second counter 202 would also be required to construct the divider 128. By utilizing the circuitry of the second counter 202 to perform the dual functions of dividing the carrier frequency and providing a portion of a latched count of the carrier frequency, the size of the first counter 110 is advantageously reduced compared to the size required in the carrier derived frequency stabilizer 100 to produce a given count resolution.

For example, if the desired frequency multiplication factor is 100,000 and the desired resolution in the frequency adjustment is one part per billion, then in the carrier derived frequency stabilizer 100, the divider 128 would require seventeen divide-by-two stages to achieve the desired multiplication factor. To achieve the desired resolution, the first counter 110 would require thirty divide-by-two stages and thirty latches.

In the carrier derived frequency stabilizer 200, the second counter 202 would require the same seventeen divide-by-two stages to achieve the same desired multiplication factor. The second counter 202 would also require a corresponding seventeen additional latches to provide the latched counter output. However, to achieve the desired resolution, the first counter 110 would require only fourteen divide-by-two stages and fourteen latches. Thus, for the example multiplication factor and adjustment resolution, the dual-counter architecture of the carrier derived frequency stabilizer 200 advantageously would eliminate sixteen divide-by-two stages at a cost of a single additional latch.

Figure 3:
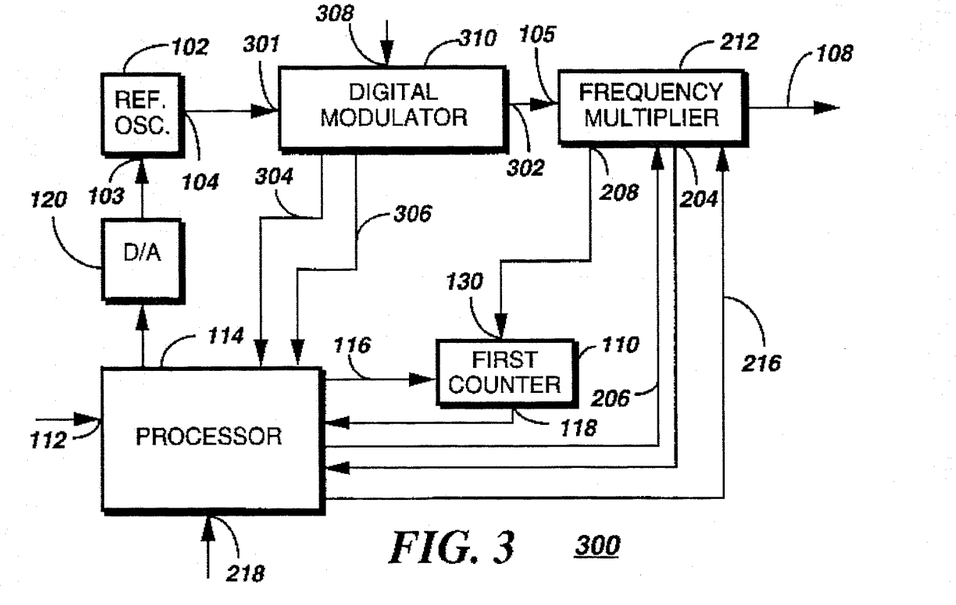
FIG. 3 is an electrical block diagram of a carrier derived frequency stabilizer and modulator in accordance with the preferred embodiment of the present invention.

Referring to FIG. 3, an electrical block diagram of a carrier derived frequency stabilizer and modulator 300 in accordance with the preferred embodiment of the present invention is similar to the carrier derived frequency stabilizer 200, the essential difference being the addition of a digital modulator 310 having a reference frequency input 301 coupled to the reference frequency output 104 for modulating the reference frequency in response to a modulation signal applied to a modulation input 308. The modulated output 302 of the digital modulator 310 is coupled to the input 105 of the frequency multiplier 212 for generating a modulated carrier frequency at the carrier frequency output 108. In addition, the digital modulator 310 is coupled to the processor 114 by a pulse add line 304 and a pulse subtract line 306.

The digital modulator 310 is preferably similar to a digital modulator disclosed in U.S. Pat. No. 5,289,141 issued Feb. 22, 1994 to Nanni et al. entitled "Method and Apparatus for Digital Modulation Using Concurrent Pulse Addition and Subtraction", which patent is hereby incorporated herein by reference. It will be appreciated that other similar modulators may be used as well for the digital modulator 310, and that a single communication line between the digital modulator 310 and the processor 114 may be substituted for the pulse add line 304 and the pulse subtract line 306.

The pulse add line 304 and the pulse subtract line 306 preferably are coupled to "PULSE ADD" and "PULSE SUBTRACT" signals, respectively, of the digital modulator 310. These signals, respectively, provide one pulse for each cycle to be added to or subtracted from the reference frequency. The processor 114 monitors the "PULSE ADD" signals and the "PULSE SUBTRACT" signals to count and form a tally of the number of "PULSE ADD" signals, less the number of "PULSE SUBTRACT" signals occurring over the predetermined interval. The tally is then multiplied by the predetermined multiplication factor of the frequency multiplier to produce a differential modulation cycle count of the carrier frequency signal.

For example, if thirty "PULSE ADD" signals and thirty-two "PULSE SUBTRACT" signals are monitored during the predetermined interval, the tally is minus two. If the predetermined multiplication factor of the frequency multiplier is 100,000, then the differential modulation cycle count would be minus 200,000. It will be appreciated that the actual multiplication factor and the actual numbers of "PULSE ADD" and "PULSE SUBTRACT" signals occurring during the predetermined interval can be substantially different from the numbers given for the simple example herein above.

One of ordinary skill in the art will recognize that the tally computed as described above is the same as the algebraic sum of a plurality of positive and negative cycle counts equivalent to a carrier frequency change corresponding to each of the modulations, multiplied by the corresponding duration of each of the modulations. For example, if the modulator increases the carrier frequency by five-thousand cycles per second for a duration of one millisecond, and then decreases the carrier frequency by five-thousand cycles per second for a duration of two milliseconds, then a positive cycle count of five and a negative cycle count of minus ten would produce a differential modulation cycle count of minus five for the three millisecond interval.

Such a differential modulation cycle count would affect the accuracy of the carrier frequency cycle count determined by the first and second counters 110, 202 if not taken into consideration. To correct for the effect of the differential modulation cycle count, the processor 114 computes and subtracts the differential modulation cycle count from the modulated measured cycle count determined by the first and second counters 110, 202, as further described herein below.

Referring to FIG. 4, a functional block diagram shows that the processor 114 utilized in the carrier derived frequency stabilizer and modulator 300 in accordance with the preferred embodiment of the present invention comprises a conventional read-only memory (ROM) 403 for non-volatile storage of operating parameters, and a conventional random access memory (RAM) 400 for temporary storage of measured and computed values. The processor 114 further includes firmware elements 401, 402, and 404 to 422 for controlling the operation of the processor 114. The firmware elements comprise a first comparator 401 for comparing the measured cycle count from the first and second counters 110, 202 with an expected cycle count corresponding to a predetermined carrier frequency to determine the drift error. The firmware elements further comprise a computation element 402 for computing from the drift error a control signal adjustment required to correct the drift error, and an adjustment element 404 coupled to the computation element 402 for adjusting the control signal for the reference oscillator 102 by the control signal adjustment to correct the drift error.

In addition, the firmware elements include a storage element 406 for storing in the RAM 400 a first value read from the first and second counter output ports 118, 204, the first value corresponding to the beginning of the predetermined interval during which the carrier frequency cycles are counted. The firmware elements also include a second value determination element 408 for determining a second value read from the first and second counter output ports 118, 204, the second value corresponding to the end of the predetermined interval. The firmware elements further comprise a second comparator 410 for comparing the first and second values to determine the measured cycle count.

The firmware elements further comprise a cycle count derivation element 412 for deriving from the plurality of positive and negative modulations a plurality of positive and negative modulation cycle counts, each modulation cycle count equivalent to a carrier frequency change corresponding to each of the modulations, multiplied by the corresponding duration. Also included in the firmware elements is a summing element 414 for determining an algebraic sum of the plurality of positive and negative modulation cycle counts over the predetermined interval to obtain a differential modulation cycle count for the predetermined interval. In addition, the firmware elements include a subtraction element 416 for subtracting the differential modulation cycle count from a modulated measured cycle count counted by the first and second counters 110, 202 during the predetermined interval to determine the measured cycle count corresponding to the carrier frequency without modulation.

The firmware elements further comprise a predetermined factor selection element 422 coupled to the frequency multiplier 212 for selecting the predetermined factor from a plurality of predetermined multiplication values for generating the second signal at the carrier frequency corresponding to a designated transmission channel. Also included is an expected cycle count determination element 418 coupled to the predetermined factor selection element 422 for determining the expected cycle count in accordance with the predetermined factor selected. Further, there is an interval determining element 420 for determining the predetermined interval from the precision time signal. The firmware elements 401, 402, and 404 to 422 cooperate with the hardware elements of the frequency stabilizer and modulator 300 to control the operation thereof in the manner depicted in the flow diagram of FIG. 5, as further described herein below.

It will be appreciated that firmware elements 401, 402, and 404 to 422 can occupy a separate ROM, or be included within the ROM 403 along with other operational parameters. It will be further appreciated that external ROM and RAM can be used as well for the ROM 403 and the RAM 400, and that other types of memory devices, e.g., electrically erasable ROM (EEROM) and electrically alterable ROM (EAROM) also can be used.

Figure 5:
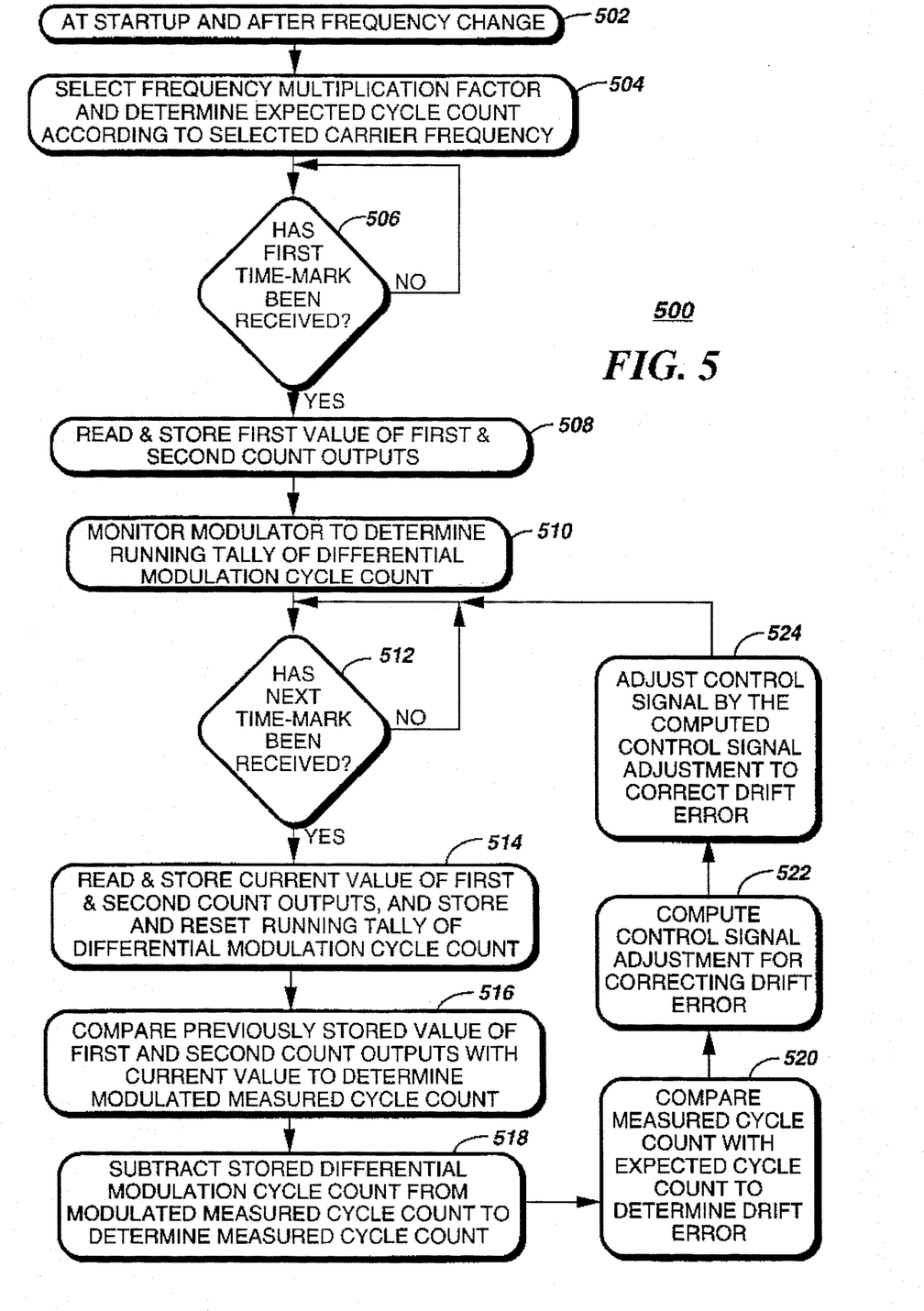
FIG. 5 is a flow diagram of a method of operating the carrier derived frequency stabilizer and modulator in accordance with the preferred embodiment of the present invention.
Figure 6:
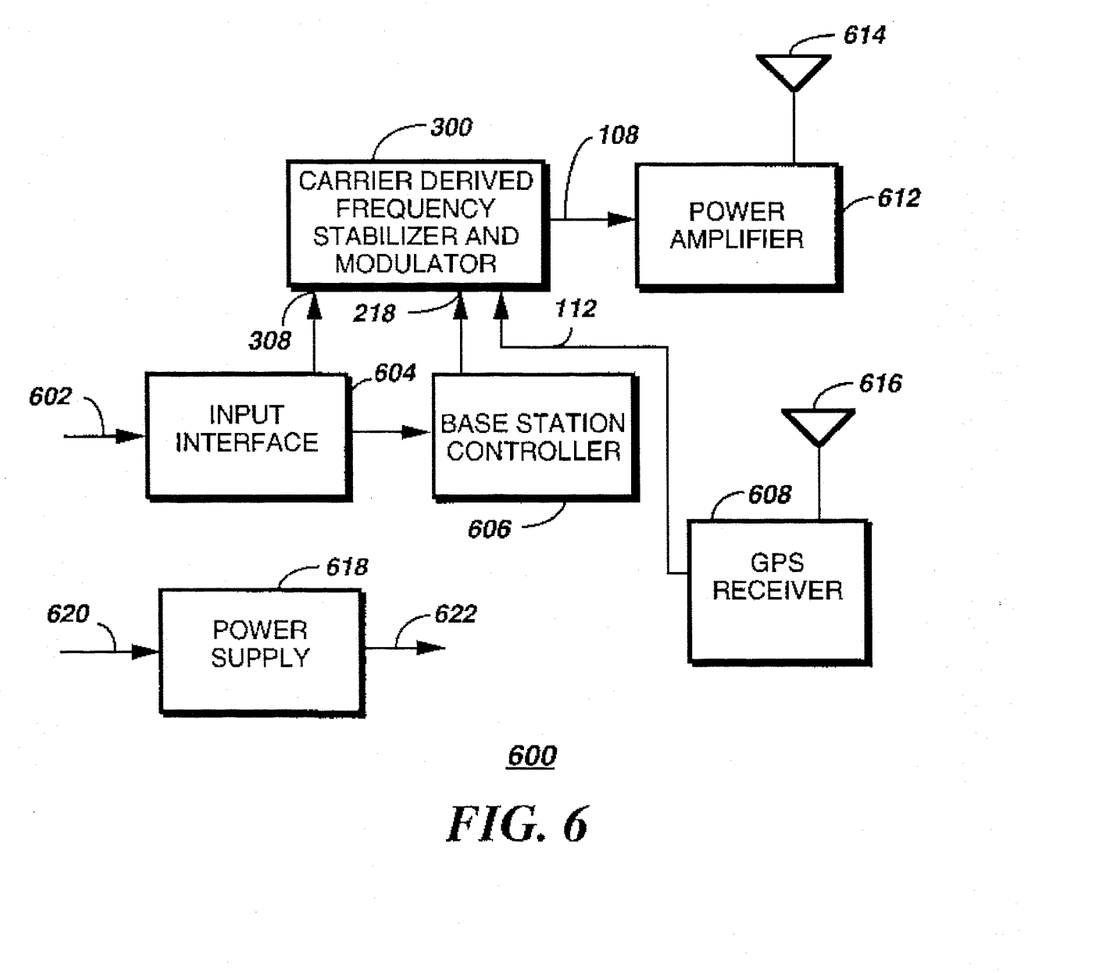
FIG. 6 is an electrical block diagram of a radio communication transmitter in accordance with the preferred embodiment of the present invention.

Referring to FIG. 5, a flow diagram 500 of a method of operating the carrier derived frequency stabilizer and modulator 300 in accordance with the preferred embodiment of the present invention is executed 502 at startup and after the transmitter frequency is changed to a new channel. First, the processor 114 accesses the predetermined factor selection element 422 to select 504 a frequency multiplication factor to be utilized to control the frequency multiplier 212 in a manner well known in the art. In addition, the processor 114 accesses the expected cycle count determination element 418 to calculate an expected cycle count for the predetermined interval, based on the predetermined measurement interval and the carrier frequency corresponding to the selected frequency multiplication factor. Preferably, the carrier frequency is selected by a signal on the channel control input 218 from the base station controller 606 (FIG. 6).

Next, the processor 114 accesses the interval determining element 420 to wait 506 to receive a first time-mark signal. When the first time-mark signal is received, the processor 114 accesses the storage element 406 to read and store 508 in the RAM 400 a first value of the first and second counter output ports 118, 204. Then the processor 114 accesses the cycle count derivation element 412 and the summing element 414 to determine 510 a running tally of the differential modulation cycle count.

When the processor 114 receives 512 the next time-mark signal, the interval determining element controls the processor 114 to access the second value determination element 408 to read and store 514 in the RAM 400 the current value of the first and second counter output ports 118, 204. In addition, the processor 114 stores the current value of the running tally of the differential modulation cycle count, and then resets the running tally to zero. Next, the processor 114 accesses the first comparator 401 and the RAM 400 to compare 516 the previously stored value of the first and second counter output ports 118, 204 with the current value to determine the modulated measured cycle count for the predetermined interval defined by the two time-mark signals.

The comparison made by the first comparator 401 is a simple subtraction of the previously stored value from the current value. If the result is a non-positive value, then during the measurement interval the first and second counters 110, 202 have reached the maximum possible count and have started over at zero, so the result must be adjusted by adding the maximum possible count of the first and second counters 110, 202, plus one, to the non-positive value.

Then the processor 114 accesses the subtraction element 416 and the RAM 400 to subtract 518 the stored value of the running tally of the differential modulation cycle count from the modulated measured cycle count for the predetermined interval to determine a measured cycle count corresponding to unmodulated carrier. The processor 114 then accesses the second comparator 410 to compare 520 the measured cycle count with the expected cycle count to determine the drift error in the carrier frequency. The processor 114 then accesses the computation element 402 to compute 522 a control signal adjustment for correcting the drift error.

Next, the processor 114 accesses the adjustment element 404 to adjust 524 the control signal applied to the control input 103 of the reference oscillator 102 by the computed control signal adjustment to correct the drift error. Then the processor 114 returns to step 512 to wait for the next time-mark signal.

Referring to FIG. 6, an electrical block diagram of a radio communication transmitter 600 in accordance with the preferred embodiment of the present invention comprises an input interface 604 for receiving over a communication link 602 from a central station (not shown) information to be transmitted and commands for controlling the radio communication transmitter 600. The input interface 604 preferably generates the modulation signal for controlling the digital modulator 310 in response to the information received from the central station. The radio communication transmitter 600 further comprises a power supply circuit 618 coupled to a power source by a power connector 620 and coupled to all power-requiring elements of the radio communication transmitter 600 for providing power thereto by a power distribution bus 622.

In addition, the radio communication transmitter 600 includes a power amplifier 612 coupled to the carrier derived frequency stabilizer and modulator 300 for amplifying the modulated carrier signal received from the carrier frequency output 108. The power amplifier 612 is coupled to an antenna 614 for transmitting the amplified modulated carrier signal to a communication receiver (not shown). Also included is a receiver 608, such as a Global Positioning Satellite receiver, for receiving the precision time signal, e.g., a stabilized one pulse-per-second signal, for defining the predetermined interval over which the carrier frequency is measured. The receiver 608 is coupled to an antenna 616 for intercepting a signal comprising the precision time signal. The receiver supplies the precision time signal to the carrier derived frequency stabilizer and modulator 300 through the time signal input 112.

The modulation input 308 of the carrier derived frequency stabilizer and modulator 300 is coupled to the input interface 604 for receiving the modulation signal therefrom. A base station controller 606 is coupled to the input interface 604 for controlling the radio communication transmitter 600 in response to commands received therefrom. In addition, the base station controller 606 is coupled to the channel control input 218 of the carrier derived frequency stabilizer and modulator 300 for selecting the transmission channel utilized by the radio communication transmitter 600.

The input interface 604, the base station controller 606, the power amplifier 612, and the power supply 618 are preferably similar to corresponding elements in the T5481 Nucleus™ base station manufactured by Motorola, Inc. of Schaumburg, Ill. The receiver 608 is preferably similar to the PVT6 Global Positioning Receiver manufactured by Motorola, Inc. of Schaumburg, Ill. It will be appreciated that other similar components can be used as well for the input interface 604, the base station controller 606, the power amplifier 612, the power supply 618, and the receiver 608.

Thus, it should now be apparent that the present invention advantageously provides a method and apparatus for a reference oscillator automatic drift control system that can provide a much greater degree of precision over a given measurement interval than conventional drift control systems have been able to achieve. In addition, there is provided an economical automatic drift control system that achieves the required precision without requiring additional interpolation circuitry and/or multipliers. The preferred embodiment in accordance with the present invention advantageously utilizes existing portions of a phase locked loop divider in the frequency multiplier for counting the carrier frequency, thereby minimizing the number of additional counter stages required to achieve a desired count accuracy during a predetermined measurement interval. In addition, the preferred embodiment automatically compensates for differential modulation effects that could otherwise cause erroneous frequency counts and corresponding erroneous adjustments of the reference frequency.

What is claimed is:

1. In a radio communication transmitter, a method of stabilizing a carrier frequency locked to a reference oscillator controlled by a control signal for generating a first signal at a reference frequency, the first signal coupled to a frequency multiplier for multiplying the reference frequency by a predetermined factor to generate a second signal at the carrier frequency, the frequency multiplier coupled to a first counter for providing a first counter output, the method comprising the steps of:

counting cycles of the carrier frequency during a predetermined interval to determine a measured cycle count;

comparing the measured cycle count with an expected cycle count corresponding to a predetermined carrier frequency to determine a drift error;

computing from the drift error a control signal adjustment required to correct the drift error; and adjusting the control signal of the reference oscillator by the control signal adjustment to correct the drift error, wherein the frequency multiplier comprises a digital phase-locked loop including a second counter for dividing the carrier frequency and for providing a second counter output, and wherein the predetermined interval is defined by a beginning and an end, and wherein the counting step comprises the steps of:

storing in a memory a first value from the first and second counter outputs, the first value corresponding to the beginning of the predetermined interval;

determining a second value from the first and second counter outputs, the second value corresponding to the end of the predetermined interval; and examining the first and second values to determine the measured cycle count.

2. The method of claim 1, wherein the frequency multiplier is coupled to a modulator for generating a plurality of positive and negative modulations of the carrier frequency to produce a modulated carrier frequency, each modulation having a corresponding duration, and wherein the counting step further comprises the steps of:

deriving from the plurality of positive and negative modulations a plurality of positive and negative modulation cycle counts, each modulation cycle count equivalent to a carrier frequency change corresponding to each of the modulations, multiplied by the corresponding duration;

determining an algebraic sum of the plurality of positive and negative modulation cycle counts over the predetermined interval to obtain a differential modulation cycle count for the predetermined interval;

counting cycles of the modulated carrier frequency during the predetermined interval to determine a modulated measured cycle count; and subtracting the differential modulation cycle count from the modulated measured cycle count to determine the measured cycle count corresponding to the carrier frequency without modulation.

3. The method of claim 2, wherein the predetermined factor is selected from a plurality of predetermined multiplication values for generating the second signal at the carrier frequency corresponding to a designated transmission channel, and wherein the comparing step comprises the step of determining the expected cycle count in accordance with the predetermined factor selected.

4. The method of claim 3, wherein the radio communication transmitter comprises a receiver for receiving a precision time signal, and wherein the step of counting the cycles of the carrier frequency further comprises the steps of:

periodically receiving the precision time signal; and determining the predetermined interval therefrom.

5. An apparatus in a radio communication transmitter for stabilizing a carrier frequency, the apparatus comprising:

reference oscillator means for generating a first signal at a reference frequency, the reference frequency controlled by a control signal from a processor means;

frequency multiplier means coupled to the reference oscillator means for multiplying the reference frequency by a predetermined factor to generate a second signal at the carrier frequency;

first counter means coupled to the frequency multiplier means for counting cycles of the carrier frequency during a predetermined interval to determine a measured cycle count, the first counter means having a first counter output port; and the processor means coupled to the reference oscillator means for controlling the same, the processor means comprising:

first comparator means coupled to the first counter means for comparing the measured cycle count with an expected cycle count corresponding to a predetermined carrier frequency to determine a drift error;

computation means for computing from the drift error a control signal adjustment required to correct the drift error; and adjustment means coupled to the computation means for adjusting the control signal for the reference oscillator means by the control signal adjustment to correct the drift error, wherein the frequency multiplier means includes a digital phase-locked loop comprising second counter means for dividing the carrier frequency, the second counter means having a second counter output port, and wherein the predetermined interval is defined by a beginning and an end, and wherein the processor means further comprises:

storage means coupled to the first and second counter means for storing a first value read from the first and second counter output ports, the first value corresponding to the beginning of the predetermined interval;

second value determination means coupled to the first and second counter means for determining a second value read from the first and second counter output ports, the second value corresponding to the end of the predetermined interval; and second comparator means coupled to the storage means and to the second value determination means for comparing the first and second values to determine the measured cycle count.

6. The apparatus of claim 5, further comprising modulator means coupled to the frequency multiplier means for generating a plurality of positive and negative modulations of the carrier frequency to produce a modulated carrier frequency, each modulation having a corresponding duration, and wherein the processor means further comprises:

cycle count derivation means coupled to the modulator means for deriving from the plurality of positive and negative modulations a plurality of positive and negative modulation cycle counts, each modulation cycle count equivalent to a carrier frequency change corresponding to each of the modulations, multiplied by the corresponding duration;

summing means coupled to the cycle count derivation means for determining an algebraic sum of the plurality of positive and negative modulation cycle counts over the predetermined interval to obtain a differential modulation cycle count for the predetermined interval; and subtraction means coupled to the summing means for subtracting the differential modulation cycle count from a modulated measured cycle count counted by the first and second counter means during the predetermined interval to determine the measured cycle count corresponding to the carrier frequency without modulation.

7. The apparatus of claim 6, wherein the processor means further comprises:

predetermined factor selection means coupled to the frequency multiplier means for selecting the predetermined factor from a plurality of predetermined multiplication values for generating the second signal at the carrier frequency corresponding to a designated transmission channel; and expected cycle count determination means coupled to the predetermined factor selection means for determining the expected cycle count in accordance with the predetermined factor selected.

8. The apparatus of claim 7, further comprising receiver means for receiving a precision time signal, and wherein the processor means further comprises interval determining means coupled to the receiver means for determining the predetermined interval from the precision time signal, and wherein the processor means is also coupled to the first and second counter means for reading from the first and second counter output ports in accordance with the predetermined interval to determine the drift error.

9. A radio communication transmitter, comprising:

an input interface for receiving from a central station information to be transmitted and commands for controlling the transmitter;

a modulator coupled to the input interface for modulating the transmitter in response to the information received;

a power supply circuit coupled to the input interface and to the modulator for providing power thereto;

a power amplifier coupled to the power supply circuit for receiving power therefrom, and coupled to an output of a frequency multiplier of an apparatus for generating a stabilized carrier frequency, the apparatus also coupled to the power supply circuit for receiving power therefrom, the apparatus comprising:

a reference oscillator for generating a first signal at a reference frequency, the reference frequency controlled by a control signal from a processor;

the frequency multiplier coupled to the reference oscillator for multiplying the reference frequency by a predetermined factor to generate a second signal at a carrier frequency, the frequency multiplier also coupled to the modulator for modulating the carrier frequency in response thereto;

a first counter coupled to the frequency multiplier for counting cycles of the carrier frequency during a predetermined interval to determine a measured cycle count, the first counter having a first counter output port; and the processor coupled to the reference oscillator for controlling the same, the processor comprising:

a first comparator coupled to the first counter for comparing the measured cycle count with an expected cycle count corresponding to a predetermined carrier frequency to determine a drift error;

a computation element for computing from the drift error a control signal adjustment required to correct the drift error; and an adjustment element coupled to the computation element for adjusting the control signal for the reference oscillator by the control signal adjustment to correct the drift error, wherein the frequency multiplier includes a digital phase-locked loop comprising a second counter for dividing the carrier frequency, the second counter having a second counter output port, and wherein the predetermined interval is defined by a beginning and an end, and wherein the processor further comprises:

a storage element coupled to the first and second counters for storing a first value read from the first and second counter output ports, the first value corresponding to the beginning of the predetermined interval;

a second value determination element coupled to the first and second counters for determining a second value read from the first and second counter output ports, the second value corresponding to the end of the predetermined interval; and a second comparator coupled to the storage element and to the second value determination element for comparing the first and second values to determine the measured cycle count.

10. The radio communication transmitter of claim 9, wherein the frequency multiplier is coupled to a modulating signal from the modulator for generating a plurality of positive and negative modulations of the carrier frequency to produce a modulated carrier frequency, each modulation having a corresponding duration, and wherein the processor further comprises:

a cycle count derivation element coupled to the modulator for deriving from the plurality of positive and negative modulations a plurality of positive and negative modulation cycle counts, each modulation cycle count equivalent to a carrier frequency change corresponding to each of the modulations, multiplied by the corresponding duration;

a summing element coupled to the cycle count derivation element for determining an algebraic sum of the plurality of positive and negative modulation cycle counts over the predetermined interval to obtain a differential modulation cycle count for the predetermined interval; and a subtraction element coupled to the summing element for subtracting the differential modulation cycle count from a modulated measured cycle count counted by the first and second counters during the predetermined interval to determine the measured cycle count corresponding to the carrier frequency without modulation.

11. The radio communication transmitter of claim 10, wherein the processor further comprises:

a predetermined factor selection element coupled to the frequency multiplier for selecting the predetermined factor from a plurality of predetermined multiplication values for generating the second signal at the carrier frequency corresponding to a designated transmission channel; and an expected cycle count determination element coupled to the predetermined factor selection element for determining the expected cycle count in accordance with the predetermined factor selected.

12. The radio communication transmitter of claim 11, further comprising a receiver for receiving a precision time signal, and wherein the processor further comprises an interval determining element coupled to the receiver for determining the predetermined interval from the precision time signal, and wherein the processor is also coupled to the first and second counters for reading from the first and second counter output ports in accordance with the predetermined interval to determine the drift error.

\* \* \* \* \*